US011482643B2

(12) United States Patent
Yamakami (10) Patent No.: US 11,482,643 B2
(45) Date of Patent: Oct. 25, 2022

(54) LIGHT-EMITTING DEVICE AND METHOD FOR MANUFACTURING LIGHT-EMITTING DEVICE

(71) Applicant: NICHIA CORPORATION, Anan (JP)

(72) Inventor: Yuya Yamakami, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 167 days.

(21) Appl. No.: 15/930,716

(22) Filed: May 13, 2020

(65) Prior Publication Data

US 2020/0365763 A1 Nov. 19, 2020

(30) Foreign Application Priority Data

May 16, 2019 (JP) .............................. JP2019-093101

(51) Int. Cl.
*H01L 33/22* (2010.01)
*H01L 33/00* (2010.01)
*H01L 33/56* (2010.01)
*C09K 11/77* (2006.01)
*H01L 33/50* (2010.01)

(52) U.S. Cl.
CPC .......... *H01L 33/22* (2013.01); *C09K 11/7706* (2013.01); *H01L 33/0093* (2020.05); *H01L 33/502* (2013.01); *H01L 33/56* (2013.01); *H01L 2933/005* (2013.01); *H01L 2933/0041* (2013.01)

(58) Field of Classification Search
CPC ... H01L 33/22; H01L 33/0093; H01L 33/502; H01L 33/56; H01L 2933/0041; H01L 2933/005; H01L 33/44; C09K 11/7706
See application file for complete search history.

(56) References Cited

U.S. PATENT DOCUMENTS

| 2005/0161771 A1 | 5/2005 | Suehiro et al. |
| 2006/0043402 A1 | 3/2006 | Suehiro et al. |
| 2006/0261364 A1 | 11/2006 | Suehiro et al. |
| 2010/0283074 A1* | 11/2010 | Kelley ................. H01L 33/02 438/33 |
| 2011/0101399 A1 | 5/2011 | Suehiro et al. |

(Continued)

FOREIGN PATENT DOCUMENTS

| JP | 2006-100787 A | 4/2006 |
| JP | 2009-147312 A | 7/2009 |

(Continued)

*Primary Examiner* — Jonathan Han
(74) *Attorney, Agent, or Firm* — Foley & Lardner LLP (57) ABSTRACT

A light-emitting device includes a light-emitting element that includes a semiconductor structure including a first semiconductor layer, a second semiconductor layer, and a light-emitting layer therebetween and is configured to emit first light from an upper surface of the first semiconductor layer; a protective film over the upper surface of the first semiconductor layer; a light-transmissive resin layer disposed in contact with the protective film; and a wavelength conversion layer facing the upper surface of the first semiconductor layer over the protective film and the light-transmissive resin layer, the upper surface of the first semiconductor layer having first projections and a flat portion, an upper surface of the protective film having second projections above the first projections. In a cross-sectional view a void is located above the flat portion and between the protective film and the light-transmissive resin layer.

7 Claims, 8 Drawing Sheets

(56) References Cited

U.S. PATENT DOCUMENTS

| | | |
|---|---|---|
| 2011/0220942 A1 | 9/2011 | Choi et al. |
| 2012/0171789 A1 | 7/2012 | Suehiro et al. |
| 2014/0042487 A1 | 2/2014 | Jeong et al. |
| 2014/0319455 A1* | 10/2014 | Miyachi ................ H01L 33/405 257/13 |
| 2014/0346440 A1 | 11/2014 | Jeong et al. |
| 2015/0115278 A1* | 4/2015 | Ichikawa ................ H01L 33/22 257/98 |
| 2015/0263242 A1 | 9/2015 | Tomizawa et al. |
| 2015/0287885 A1 | 10/2015 | Jeong et al. |
| 2016/0079480 A1 | 3/2016 | Kaneko et al. |
| 2016/0172532 A1* | 6/2016 | Rhee ..................... H01L 33/007 438/42 |
| 2016/0172542 A1 | 6/2016 | Jeong et al. |
| 2016/0351756 A1* | 12/2016 | Noichi ................... H01L 33/38 |
| 2016/0372636 A1* | 12/2016 | Hwang ................ H01L 33/507 |
| 2017/0125639 A1 | 5/2017 | Jeong et al. |
| 2018/0062045 A1 | 3/2018 | Jeong et al. |
| 2018/0097147 A1 | 4/2018 | Ichikawa |
| 2019/0044030 A1 | 2/2019 | Jeong et al. |
| 2020/0052162 A1 | 2/2020 | Jeong et al. |

FOREIGN PATENT DOCUMENTS

| | | |
|---|---|---|
| JP | 2011-192999 A | 9/2011 |
| JP | 2013-197339 A | 9/2013 |
| JP | 2014-150177 A | 8/2014 |
| JP | 2014-216493 A | 11/2014 |
| JP | 2014-225540 A | 12/2014 |
| JP | 2014-225541 A | 12/2014 |
| JP | 2015-111659 A | 6/2015 |
| JP | 2015-173142 A | 10/2015 |
| JP | 2016-026390 A | 2/2016 |
| JP | 2016-062923 A | 4/2016 |
| JP | 2016-207924 A | 12/2016 |
| JP | 2018-082027 A | 5/2018 |
| WO | WO-2004/082036 A1 | 9/2004 |

\* cited by examiner

LIGHT-EMITTING DEVICE AND METHOD FOR MANUFACTURING LIGHT-EMITTING DEVICE

CROSS-REFERENCE TO RELATED APPLICATION

This application claims priority to Japanese Patent Application No. 2019-093101, filed on May 16, 2019, the contents of which are hereby incorporated by reference in their entirety.

BACKGROUND

The present disclosure relates to a light-emitting device and a method for manufacturing a light-emitting device.

In recent years, light-emitting devices emitting white light from their emitting surfaces have been used in various lighting apparatus. The white light is a mixture of light produced by a wavelength conversion layer that converts a wavelength of a portion of blue light emitted from a light-emitting element, and blue light emitted without being subjected to wavelength conversion. For example, Japanese Patent Publication No. 2018-082027 discloses a light-emitting device that allows light emitted from an LED chip (light-emitting element) to be incident on a phosphor plate (wavelength conversion layer) through a bonding unit (light-transmissive resin layer) made of a transparent resin, to emit white light from the phosphor plate.

SUMMARY

However, a light-emitting device including a light-transmissive resin layer between a light-emitting element and a wavelength conversion layer and having a plurality of interfaces, such as the interface between the light-emitting element and the light-transmissive resin layer and the interface between the light-transmissive resin layer and the wavelength conversion layer, may cause reduction in the light-emission efficiency according to the states of the interfaces.

Accordingly, an object of the present disclosure is to provide a light-emitting device that includes a light-transmissive resin layer between a light-emitting element and a wavelength conversion layer and allows for high light extraction efficiency, and a method for manufacturing the same.

According to one embodiment, a light-emitting device includes: a light-emitting element that includes a semiconductor structure including a first semiconductor layer, a second semiconductor layer, and a light-emitting layer between the first semiconductor layer and the second semiconductor layer, the light-emitting element being configured to emit first light from an upper surface of the first semiconductor layer; a protective film over the upper surface of the first semiconductor layer; a light-transmissive resin layer disposed over the protective film in contact with the protective film; and a wavelength conversion layer facing the upper surface of the first semiconductor layer over the protective film and the light-transmissive resin layer. The upper surface of the first semiconductor layer includes a plurality of first projections and a flat portion located between the first projections. An upper surface of the protective film includes a plurality of second projections above the first projections. In a cross-sectional view, a void exists above the flat portion and between the protective film and the light-transmissive resin layer.

According to another embodiment, a method for manufacturing a light-emitting device includes: providing a light-emitting element that includes a semiconductor structure including a first semiconductor layer, a second semiconductor layer, and a light-emitting layer between the first semiconductor layer and the second semiconductor layer, the light-emitting element being configured to emit first light from an upper surface of the first semiconductor layer; etching an upper surface of the semiconductor structure into an uneven surface having a plurality of first projections and a flat portion located between the first projections; forming a protective film in contact with the upper surface of the semiconductor structure by vapor deposition; forming a light-transmissive resin layer over the protective film in contact with the protective film; and forming a wavelength conversion layer facing the upper surface of the first semiconductor layer over the protective film and the light-transmissive resin layer.

According to the light-emitting device and the method for manufacturing a light-emitting device according to the present disclosure, a light-emitting device that includes a light-transmissive resin layer between a light-emitting element and a wavelength conversion layer and allows for high light extraction efficiency and a method for manufacturing the same can be provided.

DETAILED DESCRIPTION OF EMBODIMENT

Certain embodiments of the present invention will be described below in detail on the basis of the accompanying drawings. The descriptions below include terms indicating specific directions or positions (such as "up", "down", "right", "left", and other terms containing these terms) as appropriate. These terms are used to facilitate understanding of the invention with reference to the drawings, and the meanings of these terms do not limit the technical scope of the present invention. A portion with the same reference numeral in a plurality of drawings represents the same or equivalent portion or member.

As described above, a light-emitting device including a light-emitting element, a wavelength conversion layer, and a light-transmissive resin layer between the light-emitting element and the wavelength conversion layer and having a plurality of interfaces between adjacent members may cause reduction in the light-emission efficiency according to the states of the interfaces.

The inventor of the present invention has studied inhibition of decrease in the light extraction efficiency of a light-emitting device having a plurality of interfaces between a light-emitting element and a wavelength conversion layer.

As a result, the inventor has obtained the findings below about a light-emitting device including a light-emitting element having an uneven emitting surface above which a protective film, a light-transmissive resin layer, and a wavelength conversion layer are disposed.

(a) Light returned back into the light-emitting element from the wavelength conversion layer was reduced by forming the protective film such that the protective film had an uneven surface corresponding to the uneven emitting surface, while light incident on the wavelength conversion layer from the light-emitting element was not reduced. The description that an uneven surface corresponding to the uneven emitting surface was formed indicates that projections were formed over a portion or whole of projections of the emitting surface and that depressed portions were formed over a portion or whole of depressed portions of the emitting surface.

Inspection of the vicinity of the interface between the protective film and the light-transmissive resin layer showed that the emitting surface of the light-emitting element was an uneven surface having a plurality of projections (first projections) and flat portions, the upper surface of the protective film had a plurality of second projections above the first projections, and voids were left above the flat portions of the emitting surface and between the second projections.

Considering the uneven emitting surface of the light-emitting element, the uneven upper surface of the protective film, the positions of the voids, and the reflection properties at the interface, the reason that light returned back into the light-emitting element from the wavelength conversion layer was reduced without reducing light incident on the wavelength conversion layer from the light-emitting element is described below. Light emitted from the light-emitting element is incident on the wavelength conversion layer mainly through the first projections and the second projections above the first projections. Therefore, light incident on the wavelength conversion layer is not affected by the voids above the flat portions of the emitting surface and between the second projections. On the other hand, light traveling downward from the wavelength conversion layer (returned light) is inhibited from being incident on the light-emitting element, presumably because the light was reflected by the surfaces of the second projections and the interfaces between the voids and the light-transmissive resin layer.

That is, the returned light is incident on the light-emitting element through the depressed portions in the case in which the voids are not left in the depressed portions between the second projections, but the interfaces between the voids and the light-transmissive resin layer presumably reflect the returned light in the case in which the voids are left in the depressed portions.

On the basis of the above findings, a light-emitting device according to the present disclosure is designed to include a light-emitting element having an uneven emitting surface having a plurality of projections (first projections) and flat portions, and a protective film having an upper surface having a plurality of second projections above the first projections. Further, a light-transmissive resin layer is formed over the protective film such that voids are left above the flat portions of the emitting surface and between the second projections to improve the light extraction efficiency of the light-emitting device.

As described in the finding (a) above, the shape of the uneven surface of the protective film corresponds to the shape of the uneven emitting surface of the light-emitting element. Accordingly, the shape of the uneven surface of the protective film varies according to the arithmetic average roughness of the emitting surface of the light-emitting element. The shape of the uneven surface of the protective film also varies according to the thickness of the protective film even if the arithmetic average roughness of the emitting surface of the light-emitting element is the same. Further, the positions and number of the voids vary according to the shape of the uneven surface of the protective film. That is, the positions and number of the voids on the surface of the protective film vary according to the arithmetic average roughness of the emitting surface of the light-emitting element and the thickness of the protective film.

Accordingly, the shape of the uneven surface of the protective film may be adjusted to facilitate formation of the voids between the second projections by appropriately adjusting the arithmetic average roughness of the emitting surface of the light-emitting element and the thickness of the protective film. The voids between the second projections of the surface of the protective film can facilitate reflection of light traveling downward from the wavelength conversion layer toward the wavelength conversion layer. Light emitted from the light-emitting element is extracted mainly from a region, above which the second projections are located, in which the first projections are formed. Accordingly, light traveling downward from the wavelength conversion layer should be inhibited from being incident on the light-emitting element while attenuation of light that is emitted from the light-emitting element and is incident on the wavelength conversion layer is more effectively reduced.

On the basis of the above consideration, the light extraction efficiency of the light-emitting device was evaluated, while the thickness of the protective film was changed within a certain range. The result showed that the light extraction efficiency of the light-emitting device was further improved in the case in which the protective film was thick.

From the viewpoint of the shape of the surface of the protective film when the protective film was thick, as the thickness of the protective film became greater, convex shapes formed on the surface of the protective film became smoother, and concave portions formed in the surface of the protective film increased. The convex shapes on the surface of the protective film were formed at positions corresponding to the positions above the projections of the light-emitting element, and the concave shapes in the surface of the protective film were formed at positions corresponding to the positions above the flat portions of the light-emitting element. Further, it was found that voids were likely to be formed in the concave portions between the protective film and the light-transmissive resin layer.

The light-emitting device according to the present disclosure has been completed on the basis of the above findings using the voids left in the concave portions of the surface of the protective film between the protective film and the light-transmissive resin layer and the difference between the amount of light from the projections on the light-extracting surface and the amount of light from the flat portions.

A light-emitting device according to an embodiment is described in detail below.

Figure 1:
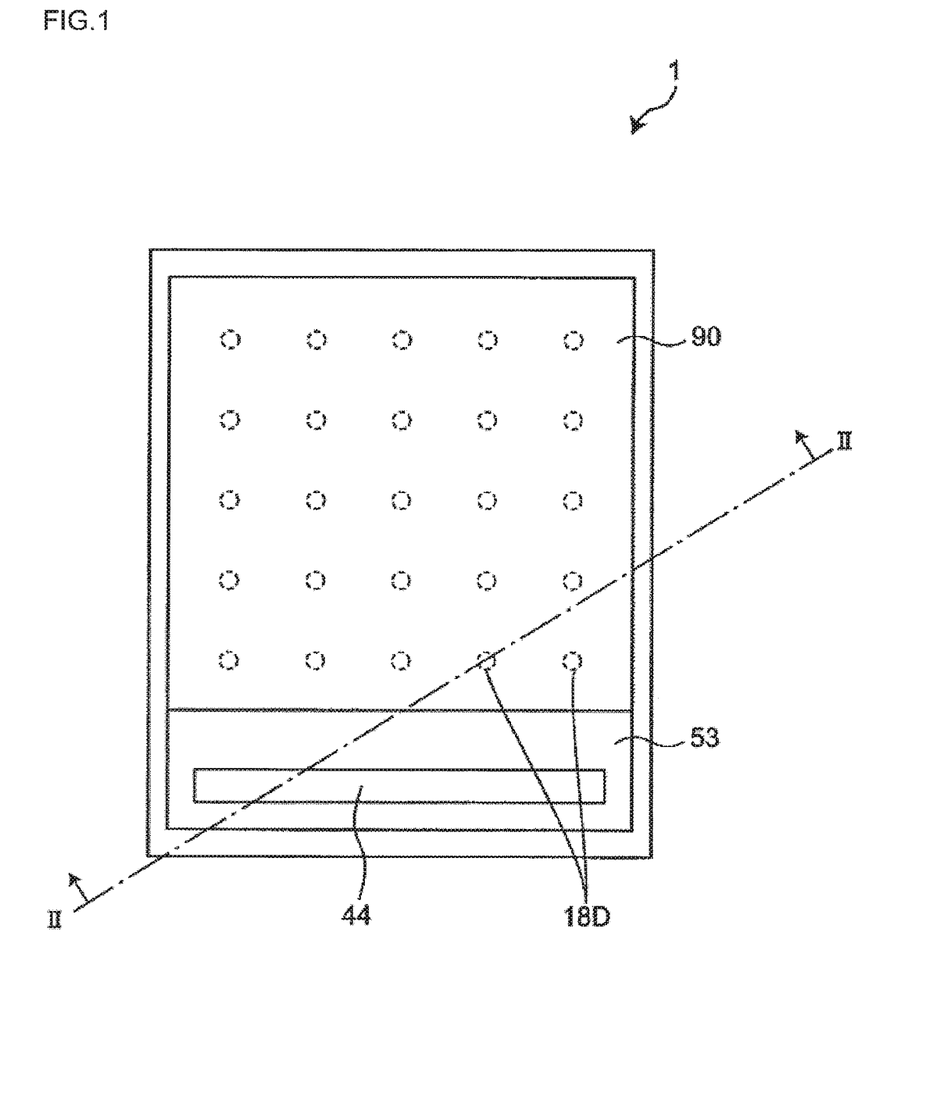
FIG. 1 is a schematic top view of a light-emitting device according to one embodiment of the present invention.
Figure 2:
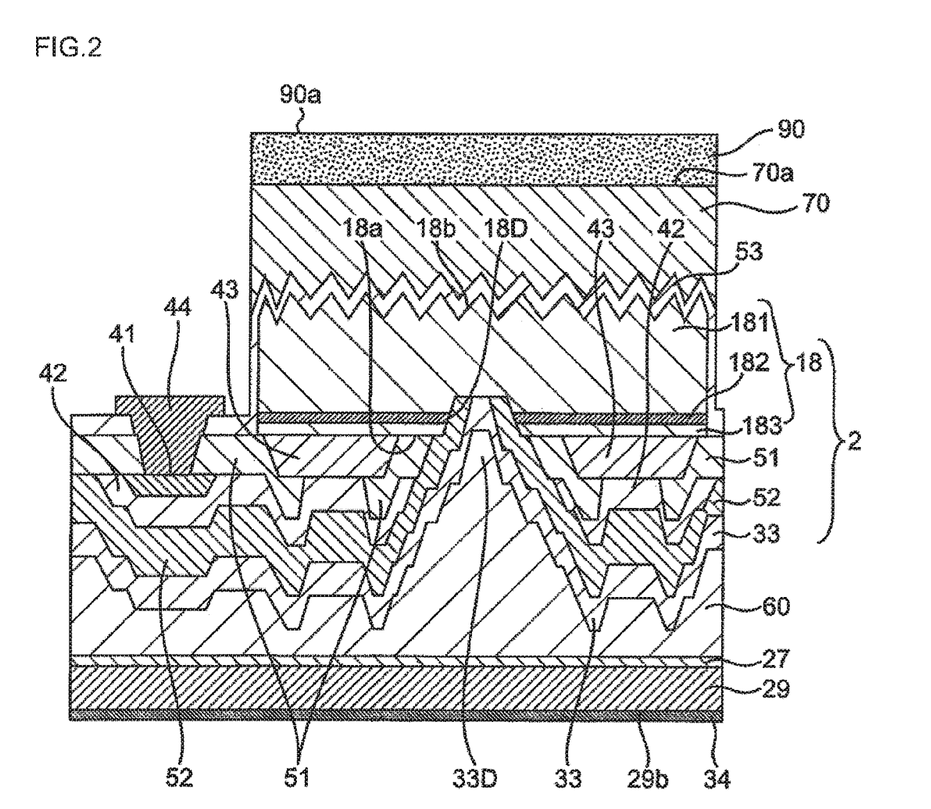
FIG. 2 is a schematic cross-sectional view taken along the line II-II of FIG. 1.
Figure 3:
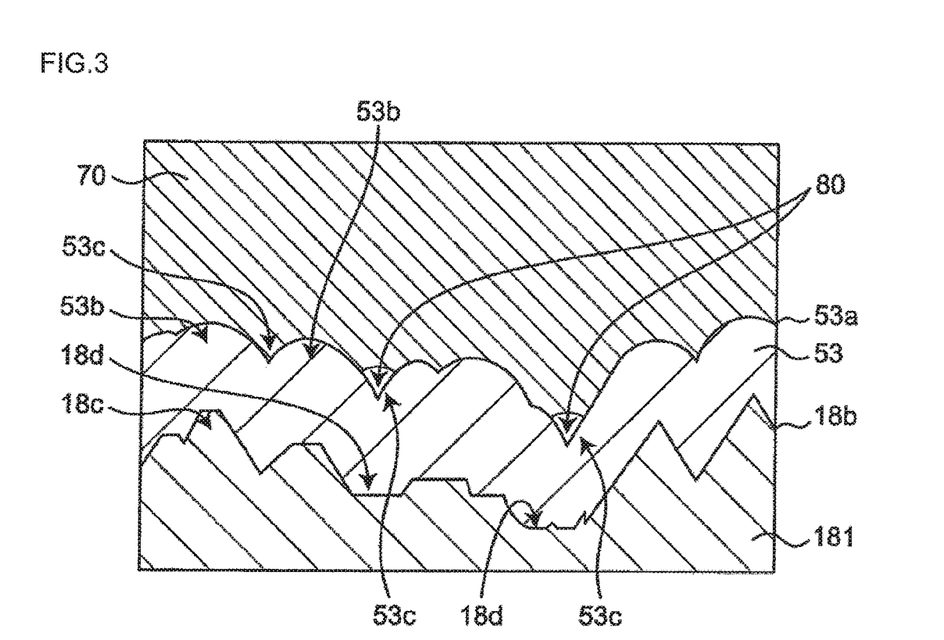
FIG. 3 is a schematic enlarged view of part of FIG. 2.

FIG. 1 is a schematic top view of a light-emitting device 1 according to the embodiment. FIG. 2 is a schematic cross-sectional view taken along the line II-II of FIG. 1. FIG. 3 is a schematic enlarged view of part of a light-emitting element 2, a protective film 53, and a light-transmissive resin layer 70 in FIG. 2.

The light-emitting device 1 includes the light-emitting element 2, the protective film 53 disposed over a light-extracting surface 18b of the light-emitting element 2, the light-transmissive resin layer 70 disposed over the protective film 53 in contact with the protective film 53, and a wavelength conversion layer 90 disposed over the light-transmissive resin layer 70 as shown in FIG. 2. In FIG. 2, the light-extracting surface 18b of the light-emitting element 2 and the interface between the protective film 53 and the light-transmissive resin layer 70 disposed above the light-emitting element 2 have regular projections and depressions, but the projections and depressions are irregular as shown in the schematic enlarged view of FIG. 3, and voids are left at predetermined positions between the protective film 53 and the light-transmissive resin layer 70.

FIG. 2 shows many components other than the light-emitting element 2, the protective film 53, the light-transmissive resin layer 70, and the wavelength conversion layer 90, but the specific configuration of the light-emitting element 2, the protective film 53, the light-transmissive resin layer 70, and the wavelength conversion layer 90 that relate to the light extraction efficiency is described below.

In the light-emitting device of the embodiment, the light-emitting element 2 includes a semiconductor structure 18. The semiconductor structure 18 includes a first semiconductor layer 181, a second semiconductor layer 183, and a light-emitting layer 182 between the first semiconductor layer 181 and the second semiconductor layer 183. The first semiconductor layer 181 may include, for example, an n-type semiconductor layer. The second semiconductor layer 183 may include, for example, a p-type semiconductor layer. The light-emitting element 2 has the light-extracting surface 18b, which is a surface of the first semiconductor layer 181, and includes a first contact electrode 33 and second contact electrodes 43 on a surface opposite to the light-extracting surface 18b. The first contact electrode 33 is connected to the first semiconductor layer 181, and the second contact electrodes 43 are connected to the second semiconductor layer 183. The first contact electrode 33 may function as, for example, an n-side contact electrode. The second contact electrodes 43 may function as, for example, p-side contact electrodes. The light-extracting surface 18b of the light-emitting element 2 is an uneven surface having a plurality of first projections 18c and flat portions 18d between the first projections 18c as shown in FIG. 3. The arithmetic average roughness of the light-extracting surface 18b, or the upper surface of the first semiconductor layer 181, is preferably 2.0 μm or more to effectively provide voids described below.

The light-emitting device of the present embodiment also includes the protective film 53 over the light-extracting surface 18b of the light-emitting element 2. An upper surface 53a of the protective film has second projections 53b as shown in FIG. 3. The second projections 53b are located above the first projections 18c of the light-extracting surface 18b. Depressed portions 53c that are convex downward (in a direction from the surface of the protective film 53 to the light-emitting element 2) are formed between the second projections 53b and above the flat portions 18d. The protective film 53 may be made of, for example, an insulating material, such as $SiO_2$, having a refractive index with respect to light emitted from the semiconductor structure 18 smaller than the refractive index of the first semiconductor layer 181. The depth of each depressed portion 53c corresponds to the distance from the top of the second projection 53b to the bottom of the depressed portion 53c. The depth may be, for example, 1 μm or more and 5 μm or less. The thickness of the protective film 53 may be preferably, for example, 800 nm or more in the case in which the arithmetic average roughness of the light-extracting surface 18b is 2.0 μm or more. This structure allows for increasing in the number of the depressed portions in which the voids are left. If the protective film 53 is too thick, the surface of the protective film 53 becomes smooth, and the second projections 53b and the depressed portions 53c are unlikely to be formed. The thickness of the protective film 53 is therefore preferably 1,200 nm or less.

The light-transmissive resin layer 70 is disposed in contact with the protective film 53. Voids 80 are left between the protective film 53 and the light-transmissive resin layer 70 at positions corresponding to the positions above the flat portions 18d. In other words, the voids 80 are left in the depressed portions 53c of the upper surface 53a of the protective film. The light-transmissive resin layer 70 may be made of, for example, an epoxy resin or a silicone resin. The refractive index of the light-transmissive resin layer 70 with respect to light emitted from the semiconductor structure 18 may be, for example, smaller than the refractive index of the first semiconductor layer 181. It is preferable that the refractive index of the light-transmissive resin layer 70 be substantially equal to the refractive index of the protective film 53 to improve the extraction efficiency of light traveling from the protective film 53 toward the light-transmissive resin layer 70.

The wavelength conversion layer 90 is excited by first light (such as blue light) emitted from the semiconductor structure 18 to emit second light (such as yellow light) with wavelengths different from the wavelengths of the first light. For example, in the case in which the wavelength conversion layer 90 is a layer containing a YAG phosphor and the semiconductor structure 18 emits blue first light, the wavelength conversion layer 90 excited by the first light emits yellow second light. The wavelength conversion layer 90 faces the light-extracting surface 18b over the protective film 53 and the light-transmissive resin layer 70. A layer other than the protective film 53 and the light-transmissive resin layer 70 may be included between the light-extracting surface 18b and the wavelength conversion layer 90. For example, the wavelength conversion layer 90 may be disposed in contact with an upper surface 70a of the light-transmissive resin layer 70 or may be separated from the upper surface 70a with another layer therebetween.

The light-emitting device 1 of the embodiment includes the protective film 53 disposed over the light-extracting surface 18b of the light-emitting element 2 and the light-transmissive resin layer 70 disposed in contact with the protective film 53 between the light-emitting element 2 and the wavelength conversion layer 90 as described above. The voids 80 are left between the protective film 53 and the light-transmissive resin layer 70, and the voids 80 are located above the flat portions 18d and between the second projections 53b.

In the light-emitting device 1 of the embodiment having the above configuration, light emitted from the light-emitting element 2 is incident on the wavelength conversion layer 90 mainly through the first projections 18c and the second projections 53b above the first projections 18c. Light incident on the wavelength conversion layer 90 is not affected by the voids 80 above the flat portions 18d of the emitting surface and between the second projections 53b. On the other hand, light emitted downward from the wavelength conversion layer 90 (returned light) is reflected by the surfaces of the second projections 53b and the voids 80 and emitted from the upper surface of the wavelength conversion layer 90. That is, in the case in which the voids 80 are not left in the depressed portions of the emitting surface, the light is reflected by the surfaces of the second projections 53b but is unlikely to be reflected by the depressed portions, so that the light is incident on the light-emitting element 2. The extraction efficiency is therefore reduced. On the other hand, in the case in which the voids 80 are formed in the depressed portions of the emitting surface as in the present embodiment, the interfaces between the light-transmissive resin layer 70 and the voids 80 can reflect the returned light to inhibit entrance of the light into the light-emitting element 2, and decrease in the light extraction efficiency is inhibited.

Accordingly, light emitted from the light-emitting element 2 can efficiently be incident on the wavelength conversion layer 90, and light that is reflected by the wavelength conversion layer 90 and is incident on the light-emitting element 2 is reduced, so that the light extraction efficiency of the light-emitting device can be enhanced.

A portion of light emitted from the light-emitting element 2 is reflected by the surface of the wavelength conversion layer 90 to become the returned light, and the returned light is reflected by the voids 80 and is incident on the wavelength conversion layer 90. Accordingly, in the light-emitting device of the embodiment, light emitted from the light-emitting element 2 can more efficiently be incident on the wavelength conversion layer 90.

The configuration of the light-emitting device 1 other than the features described above will be described below with reference to FIG. 1 and FIG. 2.

The light-emitting element 2 includes the first contact electrode 33 and the second contact electrodes 43 on the lower surface opposite to the emitting surface. The lower surface of the light-emitting element 2 is bonded to a supporting substrate 29 with a bonding layer 60 therebetween. First wiring 41 and second wiring 42 respectively connected to the first contact electrode 33 and the second contact electrodes 43 are disposed in addition to the bonding layer 60 between the light-emitting element 2 and the supporting substrate 29. The first contact electrode 33 and the second contact electrodes 43 may be made of, for example, a metal such as Al, Cu, or Ti or an alloy mainly composed of these metals. The bonding layer 60 may be made of, for example, a solder material such as NiSn or AuSn.

Specifically, as shown in FIG. 2, the second contact electrodes 43 are electrically connected to the first wiring 41 and a second pad electrode 44 via the second wiring 42. A first protective film 51 is partially formed between the second wiring 42 and the semiconductor structure 18. The semiconductor structure 18 has a first depressed portion 18D in which the light-emitting layer 182 and the second semiconductor layer 183 are not disposed above the first semiconductor layer 181 such that the first semiconductor layer 181 is exposed. The first semiconductor layer 181 is exposed at the bottom of the first depressed portion 18D. The first contact electrode 33 is formed in ohmic contact with the surface of the first semiconductor layer 181 at the bottom of the first depressed portion 18D. An insulating second protective film 52 is formed between the first contact electrode 33 and the light-emitting layer 182, the second semiconductor layer 183, and the second wiring 42 to insulate these components. In the light-emitting device 1, the supporting substrate 29 is electrically conductive, and its back surface 29b is provided with a back electrode 34. The back electrode 34 is electrically connected to the first contact electrode 33 by the bonding layer 60, a metal layer 27, and the supporting substrate 29. The metal layer 27 may function as, for example, a layer for improving the adhesion between the supporting substrate 29 and the bonding layer 60.

In the light-emitting device 1 of the embodiment, the light-emitting element 2 may be, for example, a blue light-emitting diode that emits blue light as the first light, and the semiconductor structure 18 may be made of, for example, a GaN semiconductor. The wavelength conversion layer 90 may be, for example, a layer containing a YAG phosphor and is excited by the first light (blue light) emitted from the light-emitting element 2 to emit the second light (yellow light) with wavelengths different from the wavelengths of the blue light.

A method for manufacturing the light-emitting device 1 will be described below.

Manufacturing Method

Next, the method for manufacturing the light-emitting device 1 according to the embodiment will be described with reference to FIGS. 4A through 8.

The method for manufacturing the light-emitting device 1 according to the present embodiment includes:

(1) a step of providing a light-emitting element,
(2) a step of etching,
(3) a step of forming a protective film,
(4) a step of forming a light-transmissive resin layer, and
(5) a step of forming a wavelength conversion layer.

Step of Providing Light-Emitting Element

In the step of providing a light-emitting element, a light-emitting element is provided that includes the semiconductor structure 18 including the first semiconductor layer 181, the second semiconductor layer 183, and the light-emitting layer 182 between the first semiconductor layer 181 and the second semiconductor layer 183. The light-emitting element emits the first light from the upper surface of the first semiconductor layer 181.

The step of providing a light-emitting element will be described below in detail referring to FIGS. 4A to 4H and FIG. 5.

Figure 4A:
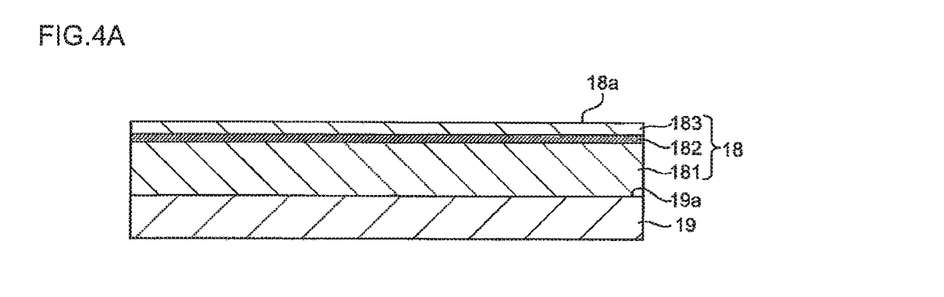
FIG. 4A is a schematic cross-sectional view showing a manufacturing process of a light-emitting device according to the embodiment of the present invention.
Figure 4B:
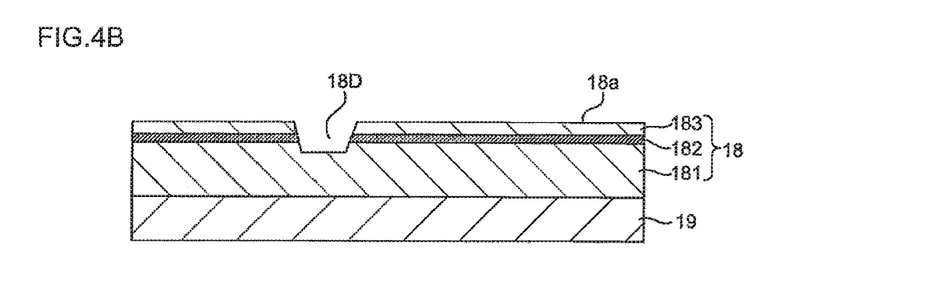
FIG. 4B is a schematic cross-sectional view showing the manufacturing process of the light-emitting device according to the embodiment of the present invention.

First, crystal growth of the first semiconductor layer 181, the light-emitting layer 182, and the second semiconductor layer 183 is performed in this order on an upper surface 19a of a growth substrate 19 to form the semiconductor structure 18 as shown in FIG. 4A. After that, the second semiconductor layer 183 and the light-emitting layer 182 at a predetermined position are removed to form the first depressed portion 18D and to expose the first semiconductor layer 181 at the bottom of the first depressed portion 18D as shown in FIG. 4B. A plurality of first depressed portions 18D are formed at predetermined positions of the semiconductor structure 18 as shown in FIG. 1. The shape of the first depressed portion 18D in a top view may be, for example, circular.

Figure 4C:
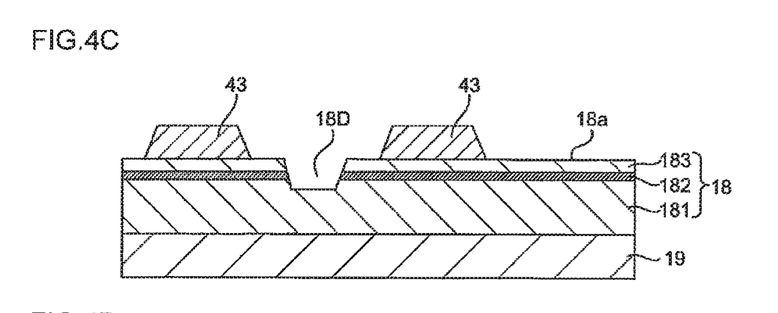
FIG. 4C is a schematic cross-sectional view showing the manufacturing process of the light-emitting device according to the embodiment of the present invention.
Figure 4D:
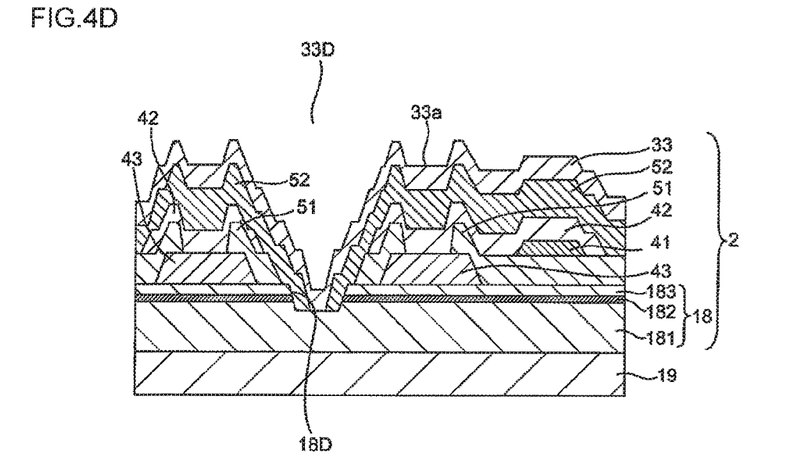
FIG. 4D is a schematic cross-sectional view showing the manufacturing process of the light-emitting device according to the embodiment of the present invention.

Next, the second contact electrodes 43 are formed on a surface 18a of the semiconductor structure 18 as shown in FIG. 4C. After that, the first protective film 51 having openings on the upper side is formed to cover the lateral surfaces and a portion of the upper surfaces of the second contact electrodes 43 as shown in FIG. 4D. Further, the first wiring 41 electrically connected to the second contact electrodes 43 in the openings of the first protective film 51 and the second wiring 42 electrically connected to the first wiring 41 are formed in a region other than the region above the first depressed portion 18D. Next, the second protective film 52 covering the second wiring 42, the first protective film 51, and the lateral surface of the first depressed portion 18D is formed. Next, the first contact electrode 33 is formed to cover the second protective film 52 and to be connected to the first semiconductor layer 181 exposed at the bottom of the first depressed portion 18D. The second protective film 52 is formed to insulate the first contact electrode 33 from the second contact electrodes 43, the first wiring 41, and the second wiring 42. The second protective film 52 is formed to insulate the first contact electrode 33 from the light-emitting layer 182 and the second semiconductor layer 183. Main components of the light-emitting element 2 are formed on the growth substrate 19 as described above.

Figure 4E:
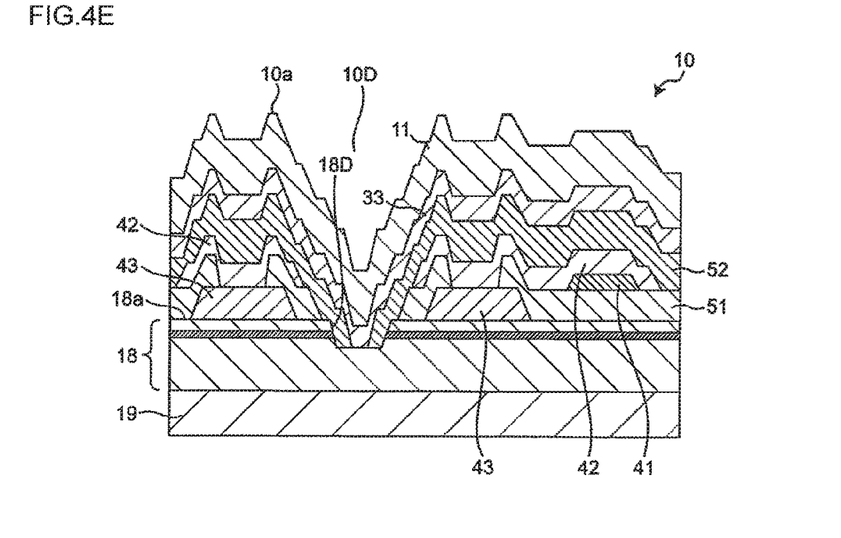
FIG. 4E is a schematic cross-sectional view showing the manufacturing process of the light-emitting device according to the embodiment of the present invention.
Figure 4F:
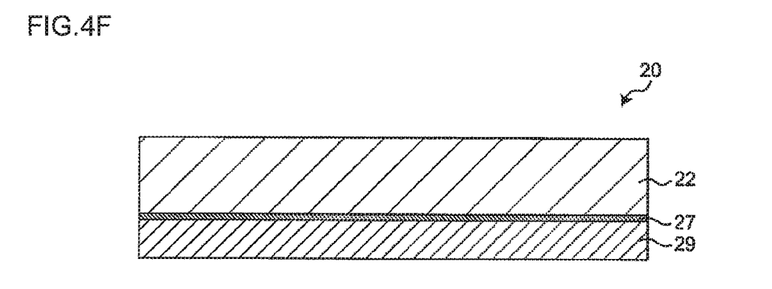
FIG. 4F is a schematic cross-sectional view showing the manufacturing process of the light-emitting device according to the embodiment of the present invention.

Next, a first member 10 in which a first metal layer 11 has been formed on the first contact electrode 33 is provided as shown in FIG. 4E.

A surface 10a (surface of the first metal layer 11) of the first member 10 provided has a second depressed portion 10D above the first depressed portion 18D. As described above, the first depressed portion 18D is a portion in which the second semiconductor layer 183 and the light-emitting layer 182 have been removed and in which the first semiconductor layer 181 is exposed at the bottom of the first depressed portion 18D. The second depressed portion 10D is formed in a region corresponding to the first depressed portion 18D and has a shape contoured to the first depressed portion 18D in a cross-sectional view.

Next, a second metal layer 22 is formed on the supporting substrate 29 by, for example, sputtering, to provide a second member 20 including the supporting substrate 29 and the second metal layer 22.

Figure 4G:
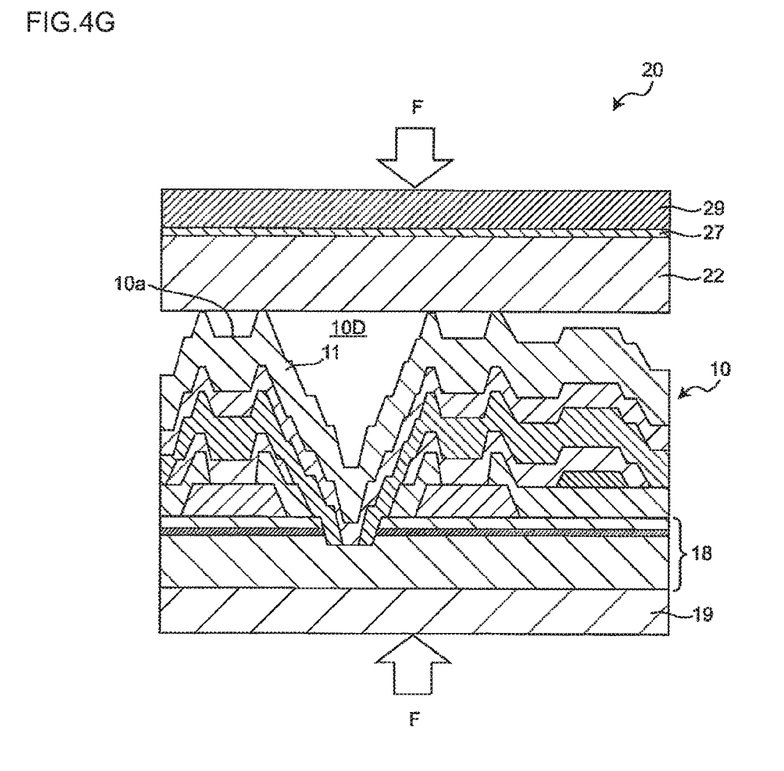
FIG. 4G is a schematic cross-sectional view showing the manufacturing process of the light-emitting device according to the embodiment of the present invention.
Figure 4H:
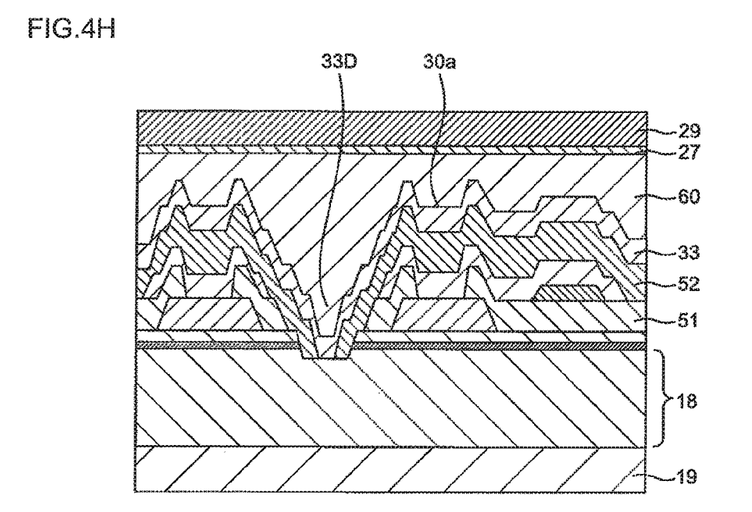
FIG. 4H is a schematic cross-sectional view showing the manufacturing process of the light-emitting device according to the embodiment of the present invention.

The first member 10 and the second member 20 provided as described above are heated such that the first metal layer 11 is in contact with the second metal layer 22 as shown in FIG. 4G. The first metal layer 11 and the second metal layer 22 are thus melted to bond the first member 10 to the second member 20 (FIG. 4H). In this example, bonding of the first member 10 to the second member forms the bonding layer 60, and the bonding layer 60 bonds the supporting substrate 29 to the light-emitting element 2.

Figure 4I:
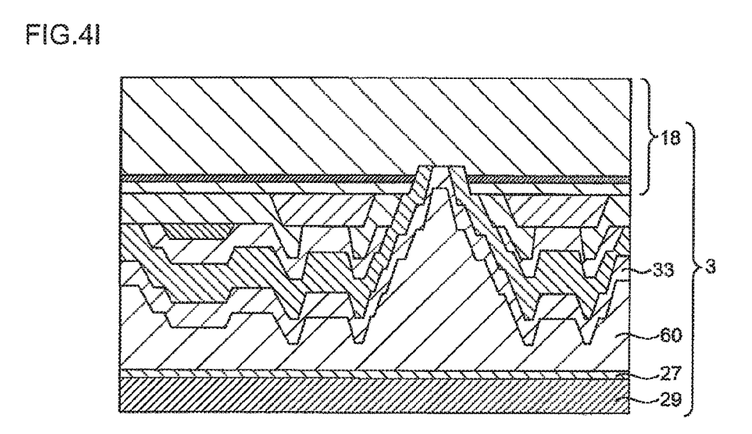
FIG. 4I is a schematic cross-sectional view showing the manufacturing process of the light-emitting device according to the embodiment of the present invention.

After the bonding, the growth substrate 19 of the first member 10 is removed from the semiconductor structure 18 as shown in FIG. 4I.

Figure 5:
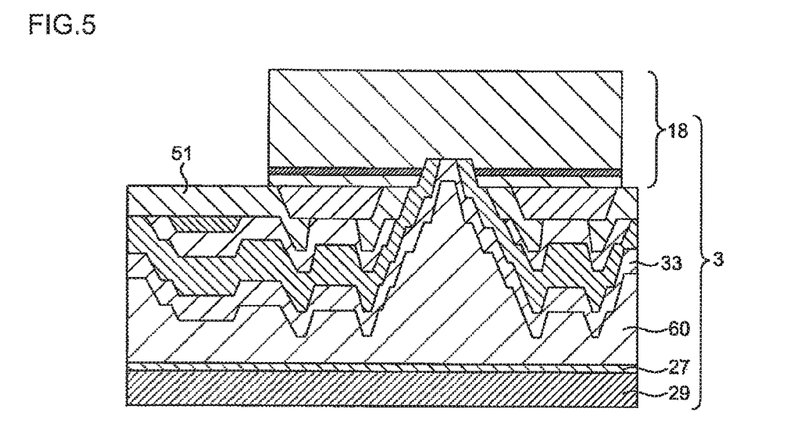
FIG. 5 is a schematic cross-sectional view showing the manufacturing process of the light-emitting device according to the embodiment of the present invention.

Next, a portion of the semiconductor structure 18 is removed to expose the first protective film 51 in a region in which the second pad electrode is to be formed as shown in FIG. 5 in order to obtain the region in which the second pad electrode 44 to be connected to the second contact electrodes 43 is to be formed. The portion of the semiconductor structure 18 may be removed by, for example, reactive ion etching (RIE).

Step of Etching

Figure 6:
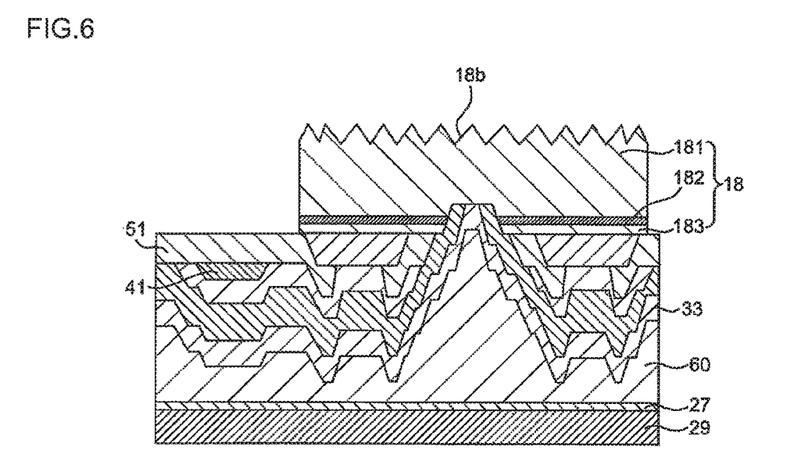
FIG. 6 is a schematic cross-sectional view showing the manufacturing process of the light-emitting device according to the embodiment of the present invention.

In the step of etching, the upper surface of the semiconductor structure 18 is etched as shown in FIG. 6.

In the step of etching, for example, the uneven light-extracting surface 18b having a plurality of first projections 18c and a plurality of flat portions 18d may be formed as the upper surface of the first semiconductor layer 181 as shown in FIG. 3 by wet etching using TMAH as the etchant. In the step of etching, the light-extracting surface 18b is preferably roughened to achieve an arithmetic average roughness of 2.0 µm or more, so that the upper surface of the protective film 53 can have the depressed portions 53c suitable for formation of the voids 80 when the protective film 53 described below is formed.

Step of Forming Protective Film

Figure 7:
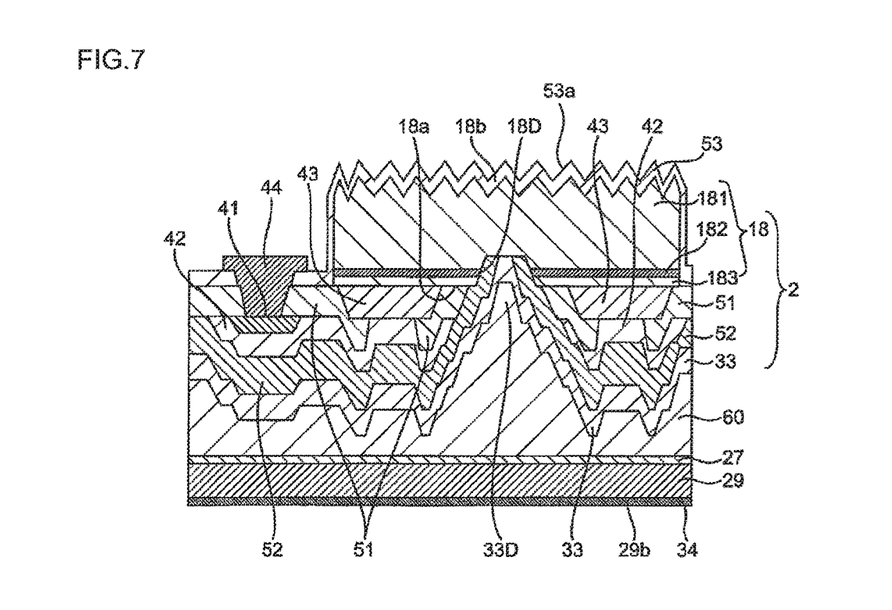
FIG. 7 is a schematic cross-sectional view showing the manufacturing process of the light-emitting device according to the embodiment of the present invention.

In the step of forming a protective film, the protective film 53 in contact with the upper surface of the semiconductor structure 18 may be formed by, for example, vapor deposition as shown in FIG. 7.

The protective film 53 may be formed to have a thickness within a range of, for example, 800 nm or more and 1,200 nm or less by, for example, vapor deposition. If the protective film 53 has such a thickness, the upper surface 53a of the protective film is likely to have the second projections 53b at positions corresponding to the positions above the first projections 18c of the light-extracting surface and the depressed portions 53c between the second projections 53b as shown in FIG. 3. The protective film 53 may be made of, for example, an insulating material, such as a material containing $SiO_2$, having a refractive index smaller than the refractive index of the light-emitting element 2. The protective film 53 may also be formed over the upper surface of the first protective film 51 exposed from a portion of the semiconductor structure 18 in the above step.

In the embodiment, after the protective film 53 is formed, the protective film 53 and the first protective film 51 are partially removed, the first wiring 41 connected to the second contact electrodes 43 is exposed, and the second pad electrode 44 is formed on the exposed first wiring 41 as shown in FIG. 7.

Step of Forming Light-Transmissive Resin Layer

Figure 8:
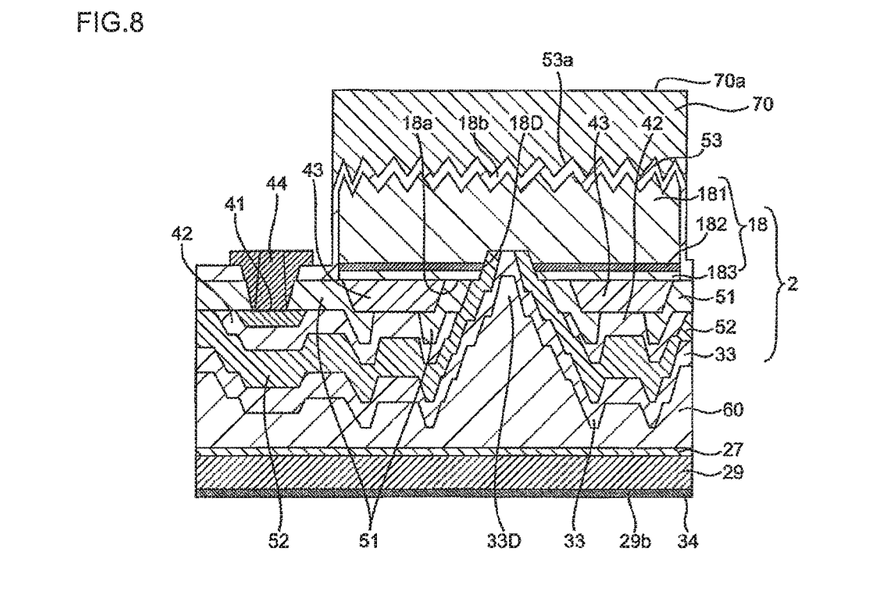
FIG. 8 is a schematic cross-sectional view showing the manufacturing process of the light-emitting device according to the embodiment of the present invention.

In the step of forming a light-transmissive resin layer, the light-transmissive resin layer 70 is formed over the protective film 53 in contact with the protective film 53 as shown in FIG. 8.

In the step of forming a light-transmissive resin layer, for example, the light-transmissive resin layer 70 may be formed by applying and curing a light-transmissive resin over the protective film 53. In the step of forming a light-transmissive resin layer, the voids 80 may be formed in the depressed portions 53c formed in the upper surface 53a of the protective film by appropriately adjusting the viscosity of the light-transmissive resin to be applied over the protective film 53. The voids 80 can thus be formed between the protective film 53 and the light-transmissive resin layer 70 at positions corresponding to the positions above the flat portions 18*d* of the upper surface of the first semiconductor layer 181. For example, the light-transmissive resin layer 70 may be made of a resin such as an epoxy resin or a silicone resin and has a refractive index smaller than the refractive index of the light-emitting element 2 and substantially equal to the refractive index of the protective film 53.

Step of Forming Wavelength Conversion Layer

In the step of forming a wavelength conversion layer, the wavelength conversion layer 90 is formed to face the upper surface of the first semiconductor layer 181 over the protective film 53 and the light-transmissive resin layer 70.

In the step of forming a wavelength conversion layer, the wavelength conversion layer 90 is placed and bonded so as to face the upper surface of the light-transmissive resin layer 70. The wavelength conversion layer 90 may be in contact with the upper surface of the light-transmissive resin layer 70 or may be spaced away from the upper surface of the light-transmissive resin layer 70. For example, the wavelength conversion layer 90 may be bonded to the upper surface of the light-transmissive resin layer 70 with a bonding layer or may be bonded by bringing the wavelength conversion layer 90 into contact with the upper surface of the light-transmissive resin layer 70 before the light-transmissive resin layer 70 is cured and curing the light-transmissive resin layer 70 after the contact is established. The wavelength conversion layer 90 may contain, for example, a phosphor, such as a YAG phosphor, excited by the first light (such as blue light) emitted from the light-emitting element 2 to emit the second light (such as yellow light) with wavelengths different from the wavelengths of the first light.

Certain embodiments and aspects of the present invention have been described, but details of the configurations disclosed may be changed. Changes in combinations of elements and orders in the described embodiments and aspects are intended to be encompassed within the scope of the present invention.

What is claimed is:

1. A light-emitting device comprising:
   a light-emitting element that comprises a semiconductor structure comprising:
   a first semiconductor layer,
   a second semiconductor layer, and
   a light-emitting layer between the first semiconductor layer and the second semiconductor layer,
   wherein the light-emitting element is configured to emit first light from an upper surface of the first semiconductor layer;
   a protective film disposed over the upper surface of the first semiconductor layer;
   a light-transmissive resin layer disposed over the protective film in contact with the protective film; and
   a wavelength conversion layer disposed over the protective film and the light-transmissive resin layer so as to face the upper surface of the first semiconductor layer;
   wherein the upper surface of the first semiconductor layer comprises a plurality of first projections and a flat portion located between the first projections;
   wherein an upper surface of the protective film comprises a plurality of second projections above the first projections; and
   wherein, in a cross-sectional view, a void is located at a location that is above the flat portion and between the protective film and the light-transmissive resin layer.

2. The light-emitting device according to claim 1,
   wherein a thickness of the protective film is within a range of 800 nm to 1,200 nm; and
   wherein an arithmetic average roughness of the upper surface of the first semiconductor layer is 2.0 μm or more.

3. The light-emitting device according to claim 2,
   wherein a refractive index of the protective film and a refractive index of the light-transmissive resin layer are smaller than a refractive index of the semiconductor structure; and
   wherein the refractive index of the protective film is substantially equal to the refractive index of the light-transmissive resin layer.

4. The light-emitting device according to claim 2,
   wherein the first light comprises blue light; and
   wherein the wavelength conversion layer contains a YAG phosphor adapted to be excited by the blue light to emit second light with a wavelength different from that of the first light.

5. The light-emitting device according to claim 1,
   wherein a refractive index of the protective film and a refractive index of the light-transmissive resin layer are smaller than a refractive index of the semiconductor structure; and
   wherein the refractive index of the protective film is substantially equal to the refractive index of the light-transmissive resin layer.

6. The light-emitting device according to claim 5,
   wherein the first light comprises blue light; and
   wherein the wavelength conversion layer contains a YAG phosphor adapted to be excited by the blue light to emit second light with a wavelength different from that of the first light.

7. The light-emitting device according to claim 1,
   wherein the first light comprises blue light; and
   wherein the wavelength conversion layer contains a YAG phosphor adapted to be excited by the blue light to emit second light with a wavelength different from that of the first light.

* * * * *